United States Patent [19]

Schutten et al.

[11] Patent Number: 4,577,052

[45] Date of Patent: Mar. 18, 1986

[54] AC SOLAR CELL

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[21] Appl. No.: 421,944

[22] Filed: Sep. 23, 1982

[51] Int. Cl.[4] ............................................ H02N 6/00

[52] U.S. Cl. .................................... 136/246; 136/244; 136/291; 136/293; 323/906

[58] Field of Search ............... 136/246, 291, 293, 244; 323/906

[56] References Cited

U.S. PATENT DOCUMENTS

| | | | |
|---|---|---|---|
| 1,640,393 | 8/1927 | Coblentz | 250/236 |
| 4,074,129 | 2/1978 | O'Hare | 250/212 |
| 4,075,034 | 2/1978 | Butler | 136/246 |
| 4,152,597 | 5/1979 | Sher | 250/370 |
| 4,217,633 | 8/1980 | Evans, Jr. | 363/27 |

OTHER PUBLICATIONS

H. A. Strobel, "Chemical Instrumentation: A Systematic Approach", Second Edition, Addison-Wesley Pub. Co. (1973), pp. 106-107, 482 and 488.

*Primary Examiner*—Aaron Weisstuch

*Attorney, Agent, or Firm*—Andrus, Sceales, Starke & Sawall

[57] ABSTRACT

An AC solar cell is provided by a pair of PN junction type solar cells connected in antiparallel between a pair of main terminals, and means for directing light alternatingly on the PN junctions to generate an alternating potential across the main terminals. AC electrical energy is generated without a DC to AC converter.

4 Claims, 2 Drawing Figures

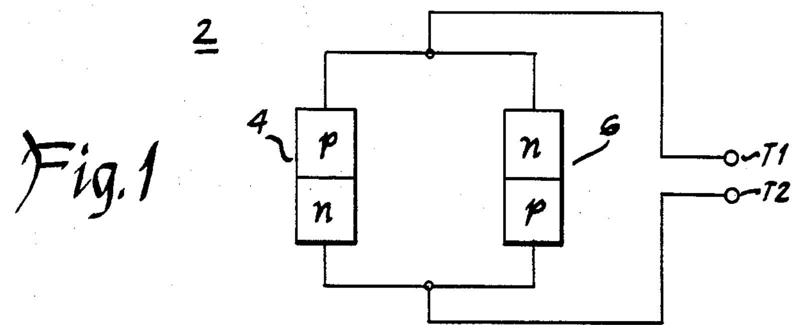
2
Fig.1
4
p
n
6
n
p
T1
T2
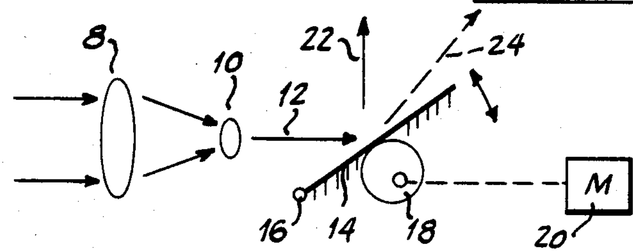
8
10
12
22
24
16
14
18
M
20
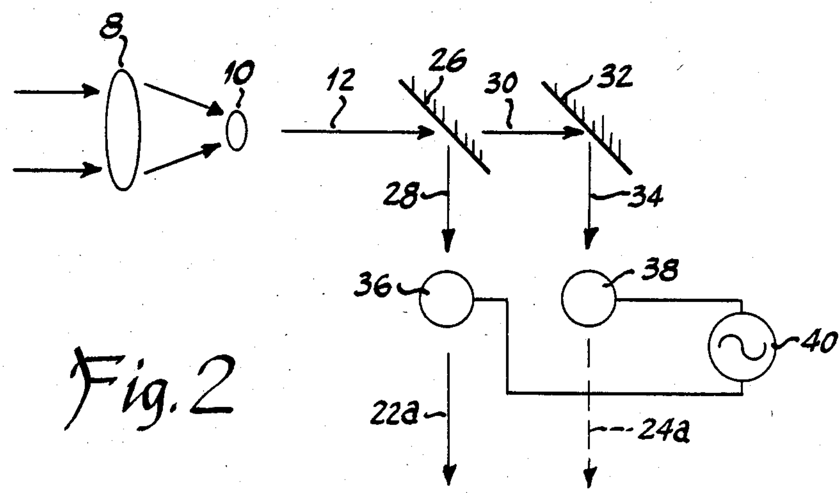
8
10
12
26
30
32
28
34
36
38
40
Fig.2
22a
24a
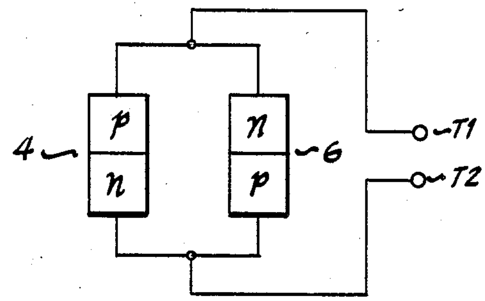
4
p
n
n
p
6
T1
T2

AC SOLAR CELL

BACKGROUND AND SUMMARY

The invention relates to the known phenomena of photovoltaic current generation due to the absorption of light energy impinging a PN junction. The energy level of the electrons in the crystal lattice increases, which causes some of the electrons to break away from their atoms, thus creating free electrons and holes.

With no voltage across a PN junction, free carriers will diffuse across the junction and set up a potential barrier. When light falls on the junction, the density of carriers diffusing across the junction will increase. If the differential voltage across the junction is high enough, a current will flow through an external resistance connected across the terminals of the device. This is commonly called a photovoltaic junction or solar cell, which converts radiant or light energy into electric energy.

Solar cells generate direct current. A DC to AC conversion must be made for those applications requiring alternating current.

The present invention provides a simple yet effective AC solar cell system. Light is converted to AC electrical energy without a DC to AC converter.

BRIEF DESCRIPTION OF THE DRAWINGS

FIG. 1 is a schematic circuit diagram of an AC solar cell constructed in accordance with the invention.

FIG. 2 is a schematic circuit diagram of an alternate embodiment of an AC solar cell constructed in accordance with the invention.

DETAILED DESCRIPTION

AC solar cell 2 in FIG. 1 includes a pair of antiparallel PN junctions 4 and 6 connected between a pair of main terminals T1 and T2. Means are provided for directing light alternately on the PN junctions to generate an alternating potential across main terminals T1 and T2.

In the embodiment in FIG. 1, light is collected and focused by a pair of lenses 8 and 10 to form a collimated beam 12. A mirror 14 is pivoted at axis 16 for mechanical reciprocation by cam 18 driven by motor 20. In the first mirror position, beam 12 is reflected along path 22 to PN junction 4. In the second mirror position, beam 12 is reflected along path 24 to PN junction 6. The light is thus split into two beams alternately impinging PN junctions 4 and 6.

FIG. 2 uses like reference numerals as FIG. 1 where appropriate to facilitate clarity. A first fixed mirror 26 is half silvered and reflects a portion of beam 12 along path 28 toward PN junction 4. The remainder of the incident light 12 passes through half silvered mirror 26 along path 30. A second fixed mirror 32 reflects the remainder beam 30 along path 34 toward PN junction 6. First and second changeable transparency means 36 and 38 are disposed in the path of a respective first and second beam 28 and 34 for blocking or passing light to a respective PN junction 4 or 6. In preferred form, Rochelle crystals are used at 36 and 38 and are controlled by an AC source 40 to change between blocking and passing states in alternating opposition to provide beams **22*a* and 24*a* comparable to beams 22 and 24 of FIG. 1**.

A mechanically controlled version is preferred for simplicity, while an electrically controlled version is preferred where greater precision is desired.

It is recognized that various modifications are possible within the scope of the appended claims.

We claim:

1. An AC solar cell comprising:

a pair of PN junction type solar cells connected in antiparallel between a pair of main terminals;

means for directing light alternatingly on said PN junctions to generate an alternating potential across said main terminals;

wherein said light directing means comprises means for splitting said light into two beams alternately impinging said PN junctions, comprising:

first mirror means reflecting a portion of the light to provide a first beam directed toward the first PN junction, and allowing the remainder of the light to pass therethrough;

second mirror means reflecting said remainder of light to provide a second beam directed toward the second PN junction;

first and second stationary changeable transparency means each disposed in the path of a respective said first and second beam for blocking or passing light to a respective said PN junction; and control means for changing said transparency means between blocking and passing states in alternating opposition.

2. The invention according to claim 1 wherein said transparency means comprises electrically controlled Rochelle crystals, and said control means comprises an AC source connected to said Rochelle crystals.

3. An AC solar cell comprising:

a pair of PN junction type solar cells connected in antiparallel between a pair of main terminals; and means for electrically directing light alternatingly without mechanical movement on said PN junctions to generate an alternating potential across said main terminals.

4. The invention according to claim 3 wherein said light directing means comprises Rochelle crystals.

* * * * *